(12) United States Patent
Kim et al.

(10) Patent No.: US 8,735,872 B2
(45) Date of Patent: May 27, 2014

(54) ORGANIC LIGHT EMITTING DIODE DISPLAY HAVING A REFLECTIVE ELECTRODE AND A REFLECTIVE LAYER

(75) Inventors: Tae-Gon Kim, Yongin (KR); Chul-Woo Jeong, Yongin (KR); Chi-Wook An, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 4 days.

(21) Appl. No.: 13/195,892

(22) Filed: Aug. 2, 2011

(65) Prior Publication Data
US 2012/0097928 A1 Apr. 26, 2012

(30) Foreign Application Priority Data
Oct. 22, 2010 (KR) .................. 10-2010-0103501

(51) Int. Cl.
*H01L 29/08* (2006.01)
(52) U.S. Cl.
USPC ..................... 257/40; 257/E27.121
(58) Field of Classification Search
USPC ........................... 257/40, E27.121
See application file for complete search history.

(56) References Cited

U.S. PATENT DOCUMENTS

| | | | |
|---|---|---|---|
| 6,280,861 B1 * | 8/2001 | Hosokawa et al. | 428/690 |
| 2004/0239658 A1 * | 12/2004 | Koyama et al. | 345/204 |
| 2005/0264184 A1 * | 12/2005 | Park et al. | 313/504 |
| 2006/0091791 A1 * | 5/2006 | Shin | 313/503 |
| 2009/0137074 A1 * | 5/2009 | Lee et al. | 438/29 |
| 2010/0052523 A1 * | 3/2010 | Kim et al. | 313/504 |

FOREIGN PATENT DOCUMENTS

| KR | 10-2006-0042779 A | 5/2006 |
|---|---|---|
| KR | 10-0600872 B1 | 7/2006 |
| KR | 10-2008-0040511 A | 5/2008 |
| KR | 10-0874458 B1 | 12/2008 |

* cited by examiner

*Primary Examiner* — Thao Le
*Assistant Examiner* — Laura Dykes
(74) *Attorney, Agent, or Firm* — Lee & Morse, P.C.

(57) ABSTRACT

An organic light emitting diode (OLED) display includes: a substrate including a first area and a second area; a first electrode at the first area of the substrate, and a first electrode at the second area of the substrate; a reflective electrode on the first electrode at the first area; a barrier rib on the substrate, the barrier rib having openings exposing the reflective electrode and the first electrode at the second area; an organic emission layer on the reflective electrode and the first electrode at the second area; a second electrode on the organic emission layer; and a reflective layer on the second electrode at the second area.

21 Claims, 4 Drawing Sheets

ORGANIC LIGHT EMITTING DIODE DISPLAY HAVING A REFLECTIVE ELECTRODE AND A REFLECTIVE LAYER

BACKGROUND

1. Field

Embodiments relate to an organic light emitting diode (OLED) display.

2. Description of the Related Art

An organic light emitting diode (OLED) display includes two electrodes and an organic emission layer disposed between the two electrodes. Electrons injected from one electrode and holes injected from the other electrode are combined in the organic emission layer, such that excitons are formed. Light is emitted by energy generated from the excitons.

The organic light emitting diode (OLED) display is classified as a top emission, bottom emission, and double-sided emission depending on the light emission direction from an organic emission layer. Different materials of pixel electrodes or common electrodes of the organic light emitting diode (OLED) display are used, according to light emission type. Since the dual-side light emitting OLED display simultaneously emits light from top and bottom surfaces of one display panel, the dual-side light emitting OLED display may increase luminance while realizing different images on the top and bottom surfaces.

The above disclosed information in the Background is only for enhancing an understanding of the described technology. Therefore, the background may contain information that does not form the prior art already known to a person of ordinary skill in the art in this country.

SUMMARY

Embodiments provide a dual-side light emitting display device.

An organic light emitting diode (OLED) display, according to an exemplary embodiment, includes: a substrate including a first area and a second area; a first electrode at the first area of the substrate, and a first electrode at the second area of the substrate; a reflective electrode on the first electrode at the first area; a barrier rib on the substrate, the barrier rib having openings exposing the reflective electrode and the first electrode at the second area; an organic emission layer on the reflective electrode and the first electrode at the second area; a second electrode on the organic emission layer; and a reflective layer on the second electrode at the second area.

The organic emission layer of the first area may top-emit light in a direction of the second electrode, and the organic emission layer of the second area may bottom-emit light in a direction of the first electrode.

The first area and the second area may be formed in one pixel.

The barrier rib opening may include a first opening exposing the reflective electrode and a second opening exposing the first electrode at the second area.

The first opening and the second opening may be formed in one pixel.

An encapsulation member on the reflective layer may be further included.

The first electrode may include a transflective material.

A lower layer of the first electrode may be made of ITO or IZO, the middle layer may be made of Ag, the upper layer may be made of ITO or IZO, and the thickness of the middle layer may be less than 200 Å.

The lower layer of the first electrode may be made of ITO or IZO, the middle layer may be made of Ag, the upper layer may be made of ITO or IZO, and the thickness of the middle layer may be more than 1000 Å.

The second electrode may include a transflective material.

The reflective layer may be made of one selected from lithium (Li), calcium (Ca), fluorinated lithium/calcium (LiF/Ca), fluorinated lithium/aluminum (LiF/Al), aluminum (Al), silver (Ag), magnesium (Mg), or gold (Au).

Also, in an organic light emitting diode (OLED) display according to another exemplary embodiment, the first area may be formed inside the top light emitting pixel among a plurality of pixels and the second area may be formed inside the bottom light emitting pixel.

The first area and the second area may be respectively formed inside the top light emitting pixel and the bottom light emitting pixel of the same color.

The barrier rib opening may include a first opening exposing the reflective electrode and a second opening exposing the first electrode of the second area.

The first opening may be formed inside the top light emitting pixel, and the second opening may be formed inside the bottom light emitting pixel.

An encapsulation member on the reflective layer may be further included.

The first electrode may include a transflective material.

The lower layer of the first electrode may be of ITO or IZO, the middle layer may be made of Ag, the upper layer may be made of ITO or IZO, and the thickness of the middle layer may be less than 200 Å.

A lower layer of the reflective electrode may be made of ITO or IZO, the middle layer may be made of Ag, the upper layer may be made of ITO or IZO, and the thickness of the middle layer may be more than 1000 Å.

The second electrode may include a transflective material.

The reflective layer may be made of one selected from lithium (Li), calcium (Ca), fluorinated lithium/calcium (LiF/Ca), fluorinated lithium/aluminum (LiF/Al), aluminum (Al), silver (Ag), magnesium (Mg), or gold (Au).

DETAILED DESCRIPTION

Figure 1:
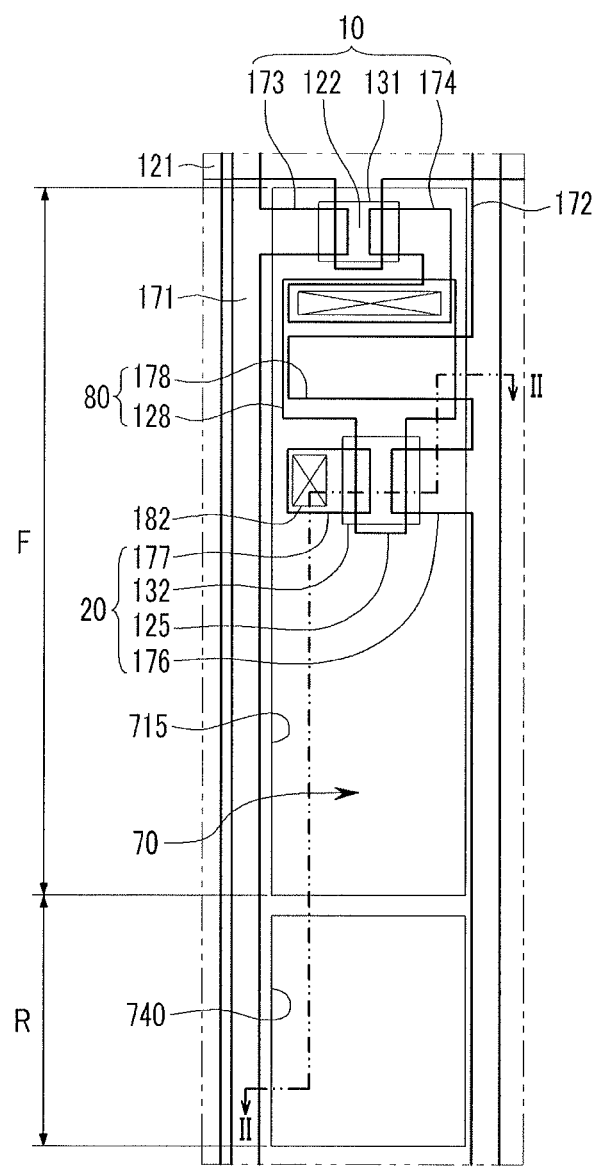
FIG. 1 is a layout view of one pixel of an organic light emitting diode (OLED) display according to the first exemplary embodiment.

Korean Patent Application No. 10-2010-0103501, filed on Oct. 22, 2010, in the Korean Intellectual Property Office, and entitled: "Organic Light Emitting Diode Display," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the inventive concept to those skilled in the art.

Furthermore, in various exemplary embodiments, like reference numerals are used for components having the same configuration representatively in a first exemplary embodiment, and other configurations different from the first exemplary embodiment are described in the other exemplary embodiments.

In the drawings, the thickness of layers, films, panels, regions, etc., are exaggerated for clarity. In addition, in the drawings, for understanding and ease of description, the thicknesses of some layers and areas are exaggerated. It will be understood that when an element such as a layer, film, region, or substrate is referred to as being "on" another element, it can be directly on the other element or intervening elements may also be present.

An organic light emitting diode (OLED) display according to the first exemplary embodiment will now be described with reference to FIGS. 1-2.

FIG. 1 is a layout view of one pixel of an organic light emitting diode (OLED) display according to the first exemplary embodiment. FIG. 2 is a cross-sectional view of the organic light emitting diode (OLED) display of FIG. 1 taken along the line II-II.

Figure 2:
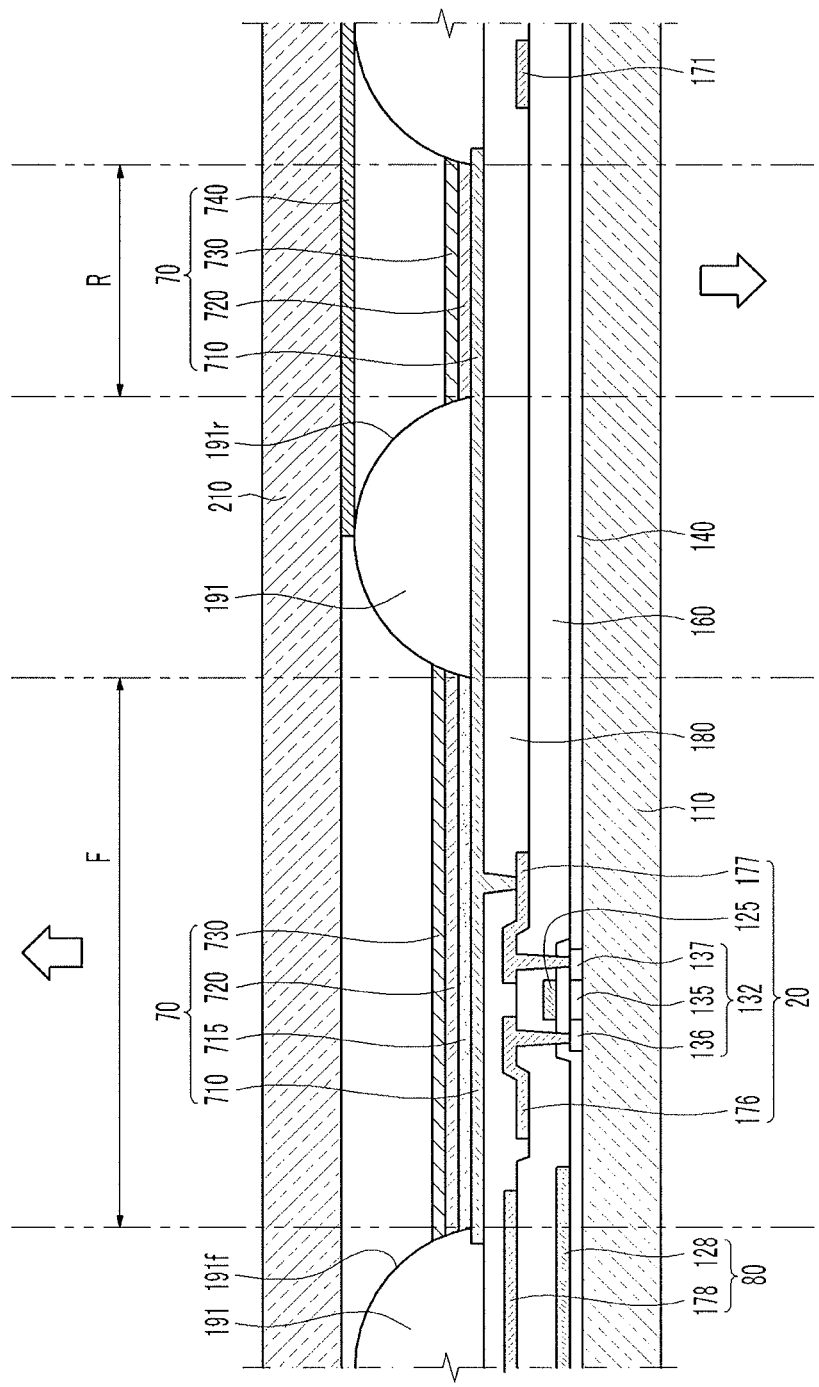
FIG. 2 is a cross-sectional view of the organic light emitting diode (OLED) display of FIG. 1 taken along the line II-II.

As shown in FIGS. 1-2, an organic light emitting diode (OLED) display includes a switching thin film transistor 10, a driving thin film transistor 20, a storage capacitor 80, and an organic light emitting diode (OLED) 70 formed for each pixel. The organic light emitting diode (OLED) display also includes a gate line 121 disposed in one direction. The OLED also includes a data line 171 and a common voltage line 172 that insulatively crosses the gate line 121. A boundary of one pixel may be defined by the gate line 121, the data line 171, and the common voltage line 172, but is not necessarily limited thereto.

The organic light emitting element 70 includes a first electrode 710, an organic emission layer 720 formed on the first electrode 710, and a second electrode 730 formed on the organic emission layer 720. The first electrode 710 is a positive (+) electrode, i.e. a hole injection electrode. The second electrode 730 is a negative (−) electrode, i.e. an electron injection electrode. However, the first embodiment is not necessarily limited thereto. Therefore, according to a driving method of the organic light emitting diode display, the first electrode 710 may be the negative electrode and the second electrode 730 may be the positive electrode. Holes and electrons from each of the first electrode 710 and the second electrode 730 are injected into the organic emission layer 720. When excitons, generated by the combination of the injected holes and electrons, are transitioned from an excited state to a ground state, light is emitted.

One pixel includes a first area F, which is a top light emitting area. The top light emitting area F has light emitted from the organic emission layer 720 in a top direction toward the second electrode 730. One pixel includes a second area R, which is a bottom light emitting area. The bottom light emitting area R has light emitted from the organic emission layer 720 in a bottom direction toward the first electrode 710.

The storage capacitor 80 includes a first storage plate 128 and a second storage plate 178 with an interlayer insulating layer 160 interposed therebetween. The interlayer insulating layer 160 becomes a dielectric. Storage capacity is determined by electric charges stored in the storage capacitor 80 and a voltage between the storage plates 128 and 178.

The switching thin film transistor 10 includes a switching semiconductor layer 131, a switching gate electrode 122, a switching source electrode 173, and a switching drain electrode 174. The driving thin film transistor 20 includes a driving semiconductor layer 132, a driving gate electrode 125, a driving source electrode 176, and a driving drain electrode 177.

The switching thin film transistor 10 is used as a switching element. The switching element selects a pixel to emit light. The switching gate electrode 122 is connected to the gate line 121. The switching source electrode 173 is connected to the data line 171. The switching drain electrode 174 is spaced apart from the switching source electrode 173. The switching drain electrode 174 is connected to a first storage plate 128.

The driving thin film transistor 20 applies a driving power to allow the organic emission layer 720, in the selected pixel, to emit light to the pixel electrode 710. The organic emission layer 720 is part of the organic light emitting diode 70. The driving gate electrode 125 is connected to the first storage plate 158. Each of the driving source electrode 176 and the second storage plate 178 are connected to the common voltage line 172. The driving drain electrode 177 is connected to the first electrode 710 of the organic light emitting diode 70 through an electrode contact hole 182.

The switching thin film transistor 10 is operated by a gate voltage applied to the gate line 121. The switching thin film transistor 10 transmits a data voltage applied to the data line 171 to the driving thin film transistor 20. A voltage is stored in the storage capacitor 80. The voltage is equivalent to a difference between a common voltage applied to the driving thin film transistor 20 from the common voltage line 172 and the data voltage transmitted from the switching thin film transistor 10. A current corresponding to the voltage stored in the storage capacitor 80 flows to the organic light emitting diode 70 through the driving thin film transistor 20. The current allows the organic light emitting diode 70 to emit light.

The structure of the organic light emitting diode display according to the first embodiment will be described according to the deposition sequence in FIG. 2.

The structure of the thin film transistor will now be described. The structure of the thin film transistor will be focused on the driving thin film transistor 20. In addition, differences between the switching thin film transistor 10 and the driving thin film transistor will be briefly described.

The driving semiconductor layer 132 is formed on a substrate 110. The substrate 110 is made of an insulating material, e.g., glass, quartz, ceramic, or plastic. However, the present embodiments are not limited thereto. Accordingly, the first substrate member 110 may be formed of a metallic material, e.g., stainless steel, etc.

The driving semiconductor layer 132 is made of a polycrystalline silicon film. The driving semiconductor layer 132 includes a channel region 135 not doped with impurities. The driving semiconductor layer 132 also includes a source region 136 and a drain region 137 doped with p+ impurities at both sides of the channel region 135. The doped ion material is a P-type impurity, e.g., boron, B2H6, etc. The impurity depends on the kind of thin film transistor.

In the first embodiment, a PMOS-structure thin film transistor with the P-type impurity has been used as the driving thin film transistor 20. However, the driving thin film transistor is not limited thereto. Therefore, either an NMOS-structure thin film transistor or a CMOS-structure thin film transistor may be used as the driving thin film transistor 20.

In FIG. 2, the driving thin film transistor 20 is a polycrystalline thin film transistor. The polycrystalline thin film includes polycrystalline silicon film. The switching thin film transistor 10, not shown in FIG. 2, may be a polycrystalline thin film transistor or an amorphous thin film transistor, including an amorphous silicon film.

A gate insulating layer 140 made of silicon nitride (SiNx) or silicon oxide (SiO2) is formed on the driving semiconductor layer 132. A gate wire including the driving gate electrode 125 is formed on the gate insulating layer 140. The gate wire further includes the gate line 121, the first storage plate 128, and other wires. The driving gate electrode 125 is overlapped with at least a part of the driving semiconductor layer 132, at the channel region 135.

The interlayer insulating layer 160 covering the driving gate electrode 125 is formed on the gate insulating layer 140. The gate insulating layer 140 and the interlayer insulating layer 160 share through-holes for exposing the source region 136 and the drain region 137 of the driving semiconductor layer 132. The interlayer insulating layer 160 is made of a ceramic-based material, e.g. silicon nitride ($SiN_x$) or silicon oxide ($SiO_2$). The interlayer insulating layer 160 is, therefore, made of similar materials as the gate insulating layer 140.

On the interlayer insulating layer 160, the data wire is formed. The data wire includes the driving source electrode 176 and driving drain electrode 177. The data wire also includes the data line 171, the common power line 172, the second capacitor plate 178, and the other wire. The driving source electrode 176 and driving drain electrode 177 are connected to the source region 136 and drain region 137 of the driving semiconductor layer 132 through through-holes. The through-holes are formed in the interlayer insulating layer 160 and gate insulating layer 140.

The driving thin film transistor 20 is formed. The driving thin film transistor 20 includes the driving semiconductor layer 132, driving gate electrode 155, driving source electrode 176, and driving drain electrode 177. The configuration of the driving thin film transistor 20 is not limited to the above examples, but may be variously modified with known configurations that can be easily performed by those skilled in the art.

On the interlayer insulating layer 160, a planarization layer 180 that covers the data wires 172, 176, 177, and 178 is formed. The planarization layer 180 removes a step, i.e., a height difference between the data wires. The planarization layer 180 increases the luminous efficiency of the organic light emitting diode 70 formed on the planarization layer 180. The planarization layer 180 has an electrode contact hole 182 that exposes a portion of the drain electrode 177 formed therein.

The planarization layer 180 may be made of at least one material of acryl resins (polyacrylate resins), epoxy resins, phenolic resins, polyamide resins, polyimide resins, unsaturated polyesters resins, polyphenylenether resins, polyphenylene sulfide resins, and benzocyclobutene (BCB).

The first exemplary embodiment is not limited to the above structures. If necessary, any of the planarization layer 180 and the interlayer insulating layer 160 may be omitted.

On the planarization layer 180, the first electrode 710 is formed. The first electrode 710 is part of the organic light emitting diode 70. The first electrode 710 is formed on the top light emitting area F and the bottom light emitting area R. The first electrode 710 is connected to the drain electrode 177 through the electrode contact hole 182 of the planarization layer 180.

The first electrode 710 may be made of a transflective material. The first electrode 710 may be formed with triple layers. In this scenario, the lower layer of the first electrode 710 may be made of ITO (indium tin oxide) or IZO (indium zinc oxide). The middle layer of the first electrode 710 may be made of a material, e.g., lithium (Li), calcium (Ca), fluorinated lithium/calcium (LiF/Ca), fluorinated lithium/aluminum (LiF/Al), aluminum (Al), silver (Ag), magnesium (Mg), or gold (Au). The upper layer of the first electrode 710 may be made of ITO (indium tin oxide) or IZO (indium zinc oxide). When the middle layer of the first electrode 710 is made of silver (Ag), it is preferable that the thickness of the middle layer is less than 200 Å. When the thickness of the middle layer is more than 200 Å, it is difficult for light to transmit through the first electrode 710.

A reflective electrode 715 is formed on the first electrode 710 where the top light emitting area F is positioned. The reflective electrode 715 may be formed with triple layers. In this scenario, the lower layer of the reflective electrode 715 may be made of ITO (indium tin oxide) or IZO (indium zinc oxide). The middle layer of the reflective electrode 715 may be made of a material, e.g., lithium (Li), calcium (Ca), fluorinated lithium/calcium (LiF/Ca), fluorinated lithium/aluminum (LiF/Al), aluminum (Al), silver (Ag), magnesium (Mg), or gold (Au). The upper layer of the reflective electrode 715 may be made of ITO (indium tin oxide) or IZO (indium zinc oxide). When the middle layer of the reflective electrode 715 is made of silver (Ag), it is preferable that the thickness of the middle layer is more than 1000 Å. When the thickness of the middle layer is less than 1000 Å, it is difficult for light to be reflected in the reflective electrode 715. When the upper layer of the first electrode 710 is formed with the same material of ITO or IZO as the lower layer of the reflective electrode 715, the lower layer of the reflective electrode 715 may be omitted.

A barrier rib 191, having a first opening 191f and a second opening 191r, is formed on the planarization layer 180. The first opening 191f exposes the reflective electrode 715. The second opening 191r exposes the first electrode 710 positioned at the bottom light emitting area R. The reflective electrode 715 corresponds to the first opening 191f of the barrier rib 191. The first electrode 710 is positioned at the bottom light emitting area R to correspond to the second opening 191r. The first opening 191f and the second opening 191r are formed inside one pixel. The barrier rib 191 may be made of a resin-based or silica-based inorganic material, e.g., a polyacryl-based resin and polyimides.

The organic emission layer 720 is formed on the reflective electrode 715 at the top light emitting area F. The first electrode 710 is positioned at the bottom light emitting area R. The organic emission layer 720, formed on the reflective electrode 715, is positioned at the top light emitting area F. The organic emission layer 720 formed on the first electrode 710 is positioned at the bottom light emitting area R. The organic emission layer 720 at the top light emitting area F and the organic emission layer 720 at the bottom light emitting area R are separated from each other by the barrier rib 191.

The organic emission layer 720 is made of a low molecular weight organic material or a high molecular weight organic material, e.g. poly3,4-ethylenedioxythiophene (PEDOT).

The organic emission layer 720 may be formed with multiple layers including at least one of an emission layer, a hole injection layer (HIL), a hole transport layer (HTL), an electron transport layer (ETL), and an electron injection layer (EIL). When all layers are included, the hole injection layer (HIL) is disposed on the pixel electrode 710, an anode, and the hole transport layer (HTL). The emission layer, the electron transport layer (ETL), and the electron injection layer (EIL) are sequentially stored thereon.

The second electrode 730 is formed on the organic emission layer 720 at the top light emitting area F and the organic emission layer 720 at the bottom light emitting area R.

The second electrode 730 may be formed of a transflective material. The second electrode 730 may be formed with triple layers. In this scenario, the lower layer of the second electrode 730 may be made of ITO (indium tin oxide) or IZO (indium zinc oxide). The middle layer of the second electrode 730 may be made of a material, e.g., lithium (Li), calcium (Ca), fluorinated lithium/calcium (LiF/Ca), fluorinated lithium/aluminum (LiF/Al), aluminum (Al), silver (Ag), magnesium (Mg), or gold (Au). The upper layer of the second electrode 730 may be made of ITO (indium tin oxide) or IZO (indium zinc oxide). When the middle layer of the second electrode 730 is made of silver (Ag), it is preferable that the thickness of the middle layer is less than 200 Å. When the thickness of the middle layer is more than 200 Å, it is difficult for light to transmit through the second electrode 730.

The organic light emitting element 70 is formed. The organic light emitting element 70 includes the first electrode 710, the organic emission layer 720, and the second electrode 730.

On the second electrode 730, an encapsulation member 210 faces the display substrate 110. The encapsulation member 210 is made of a transparent material, e.g., glass and plastic.

A reflective layer 740 is formed between the encapsulation member 210 and the second electrode 730 in the bottom light emitting area R. The reflective layer 740 may be separated from the second electrode 730 by a predetermined interval, or may contact the second electrode 730.

The reflective layer 740 may be made of the reflective material, e.g., lithium (Li), calcium (Ca), fluorinated lithium/calcium (LiF/Ca), fluorinated lithium/aluminum (LiF/Al), aluminum (Al), silver (Ag), magnesium (Mg), or gold (Au).

The light emitted from the organic emission layer 720 is emitted in the front side by the reflective electrode 715 in the top light emitting area F. The light emitted from the organic emission layer 720 is emitted in the rear side by the reflective layer 740 in the bottom light emitting area R. The top light emitting area F and the bottom light emitting area R are both formed in one pixel such that the dual-side light emitting type organic light emitting diode (OLED) display of the thin film type may be a simple manufacturing process.

The reflective electrode 715, formed in the top light emitting area F, generates the micro-cavity effect along with the second electrode 730. The second electrode 730 is made of transflective material. In the micro-cavity structure, the light is repeatedly reflected between the reflective electrode 715 and the second electrode 730. The reflective electrode 715 and the second electrode 730 are spaced from each other by a predetermined optical length and made of transflective material such that light of a specific wavelength is enhanced through constructive interference. The reflective layer 740, formed in the bottom light emitting area R, generates the micro-cavity effect along with the first electrode 710. The first electrode 710 is made of transflective material such that the organic light emitting diode (OLED) display, according to the first exemplary embodiment, can realize good display qualities, e.g., high photo-efficiency and high color purity.

The top light emitting area F and the bottom light emitting area R are both formed in one pixel such that the dual-side light emitting type of organic light emitting diode (OLED) display of the thin film type may be a simple manufacturing process. However, the top light emitting area and the bottom light emitting area may be formed together, inside different pixels, of the same color.

Figure 3:
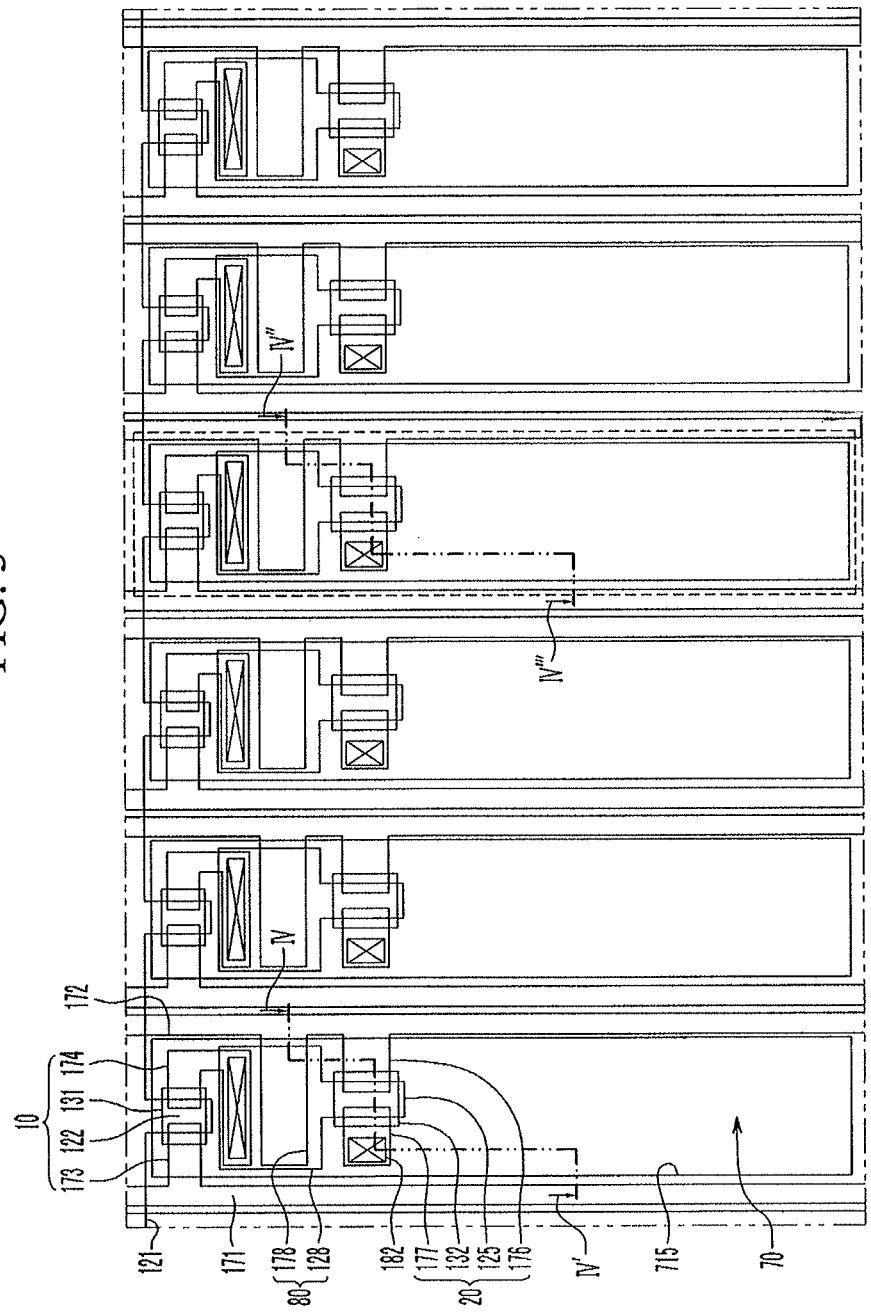
FIG. 3 is a layout view of a plurality of pixels of an organic light emitting diode (OLED) display according to the second exemplary embodiment.
Figure 4:
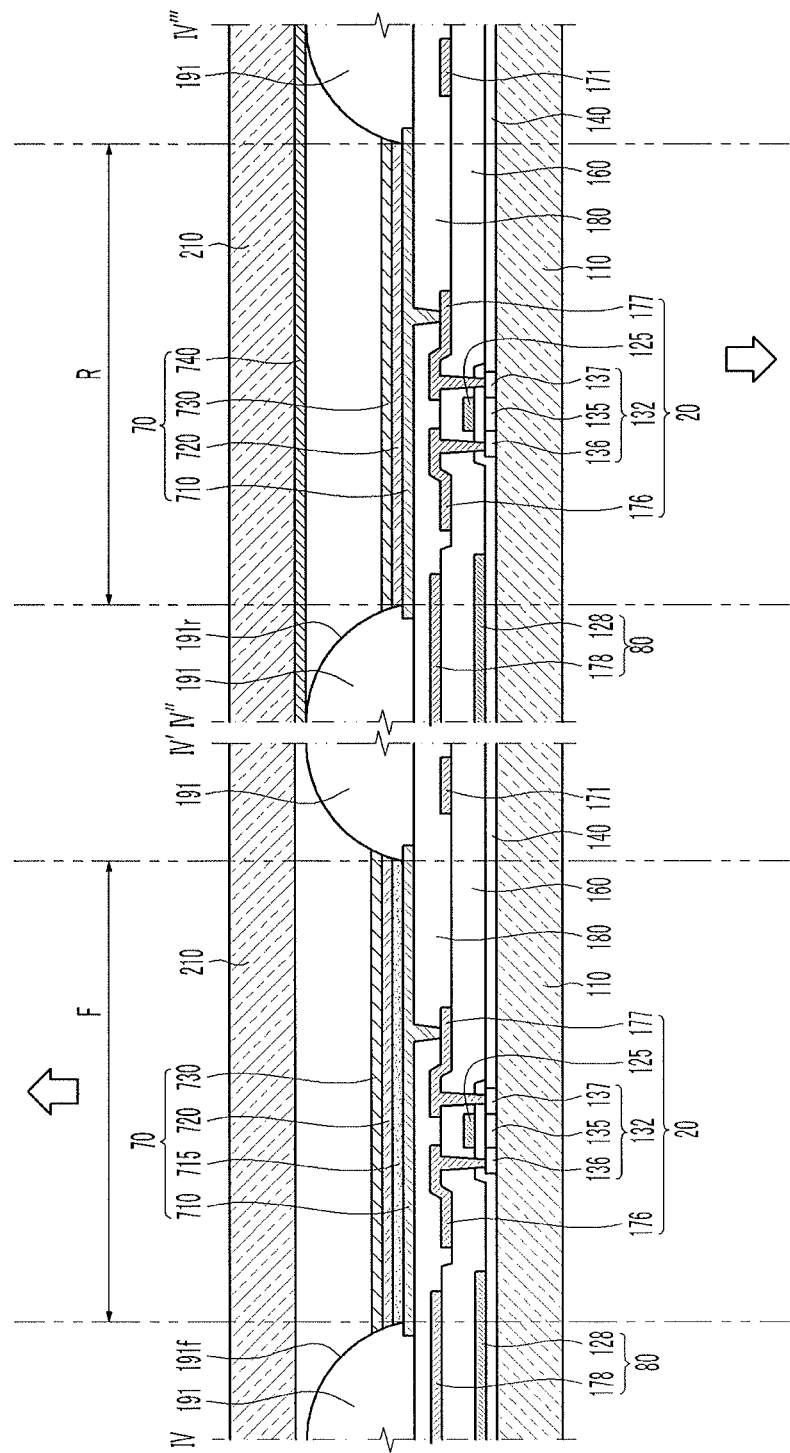
FIG. 4 is a cross-sectional view of the organic light emitting diode (OLED) display of FIG. 3 taken along the line IV-IV' and IV'''-IV''''.

FIG. 3 is a layout view of a plurality of pixels of an organic light emitting diode (OLED) display according to the second exemplary embodiment. FIG. 4 is a cross-sectional view of the organic light emitting diode (OLED) display of FIG. 3 taken along the line IV-IV' and IV'''-IV'''.

The second exemplary embodiment, except for the top light emitting pixel and the bottom light emitting pixel formed in the same color, is substantially equivalent to the first exemplary embodiment shown in FIGS. 1-2 such that overlapping description is omitted.

As shown in FIGS. 3-4, the organic light emitting diode (OLED) display, according to the second exemplary embodiment, includes a top light emitting pixel Pf and a bottom light emitting pixel Pr having the same color. The top light emitting pixel Pf includes a top light emitting area F, i.e. the first area where the light emitted from the organic emission layer 720 is emitted in the top direction of the second electrode 730. The bottom light emitting pixel Pr includes the bottom light emitting area R, i.e. the second area where the light emitted from the organic emission layer 720 is emitted in the bottom direction of the first electrode 710.

The first electrode 710 is formed on the planarization layer 180 of the top light emitting pixel Pf and the bottom light emitting pixel Pr. The first electrode 710 of the top light emitting pixel Pf and the first electrode 710 of the bottom light emitting pixel Pr are separated from each other.

The first electrode 710 may be made of transflective material. Thus, the first electrode 710 may be formed with triple layers. In this scenario, the lower layer of the first electrode 710 may be made of ITO (indium tin oxide) or IZO (indium zinc oxide). The middle layer of the first electrode 710 may be made of a material, e.g., lithium (Li), calcium (Ca), fluorinated lithium/calcium (LiF/Ca), fluorinated lithium/aluminum (LiF/Al), aluminum (Al), silver (Ag), magnesium (Mg), or gold (Au). The upper layer of the first electrode 710 may be made of ITO (indium tin oxide) or IZO (indium zinc oxide). When the middle layer of the first electrode 710 is made of silver (Ag), it is preferable that the thickness of the middle layer is less than 200 Å. When the thickness of the middle layer is more than 200 Å, it is difficult for light to transmit through the first electrode 710.

A reflective electrode 715 is formed on the first electrode 710 where the top light emitting area F is positioned. The reflective electrode 715 may be formed with triple layers. In this scenario, the lower layer of the reflective electrode 715 may be made of ITO (indium tin oxide) or IZO (indium zinc oxide). The middle layer of the reflective electrode 715 may be made of a material, e.g., lithium (Li), calcium (Ca), fluorinated lithium/calcium (LiF/Ca), fluorinated lithium/aluminum (LiF/Al), aluminum (Al), silver (Ag), magnesium (Mg), or gold (Au). The upper layer of the reflective electrode 715 may be made of ITO (indium tin oxide) or IZO (indium zinc oxide). When the middle layer of the reflective electrode 715 is made of silver (Ag), it is preferable that the thickness of the middle layer is more than 1000 Å. When the thickness of the middle layer is less than 1000 Å, it is difficult for light to be reflected in the reflective electrode 715. When the upper layer of the first electrode 710 is formed with the same material of ITO or IZO as the lower layer of the reflective electrode 715, the lower layer of the reflective electrode 715 may be omitted.

A barrier rib 191 having a first opening 191f is formed on the planarization layer 180. The first opening 191f exposes the reflective electrode 715 of the top light emitting pixel Pf and a second opening 191r exposing the first electrode 710 of bottom light emitting pixel Pr. The reflective electrode 715 corresponds to the first opening 191f of the barrier rib 191. The first opening 191f is positioned at the top light emitting pixel Pf. The second opening 191r is positioned at the bottom light emitting pixel Pr.

An organic emission layer 720 is formed on the reflective electrode 715. The organic emission layer 720 is positioned at the top light emitting pixel Pf. The first electrode 710 is positioned at the bottom light emitting pixel Pr.

The organic emission layer 720, formed on the reflective electrode 715, is positioned at the top light emitting pixel Pf. The organic emission layer 720, formed on the first electrode 710, is positioned at the bottom light emitting pixel Pr. The organic emission layer 720 at the top light emitting pixel Pf and the organic emission layer 720 at the bottom light emitting pixel Pr are separated from each other by the barrier rib 191.

The second electrode 730 is formed on the organic emission layer 720, formed at the top light emitting pixel Pf, and the organic emission layer 720, formed at the bottom light emitting pixel Pr.

The second electrode 730 may be formed of transflective material. The second electrode 730 may be formed with triple layers. In this scenario, the lower layer of the second electrode 730 may be made of ITO (indium tin oxide) or IZO (indium zinc oxide). The middle layer of the second electrode 730 may be made of a material, e.g., lithium (Li), calcium (Ca), fluorinated lithium/calcium (LiF/Ca), fluorinated lithium/aluminum (LiF/Al), aluminum (Al), silver (Ag), magnesium (Mg), or gold (Au). The upper layer of the second electrode 730 may be made of ITO (indium tin oxide) or IZO (indium zinc oxide). When the middle layer of the second electrode 730 is made of silver (Ag), it is preferable that the thickness of the middle layer is less than 200 Å. When the thickness of the middle layer is more than 200 Å, it is difficult for light to transmit through the second electrode 730.

The organic light emitting element 70 is formed. The organic light emitting element 70 includes the first electrode 710, the organic emission layer 720, and the second electrode 730.

On the second electrode 730, the encapsulation member 210 faces the display substrate 110. The encapsulation member 210 is made of a transparent material, e.g., glass and plastic.

The reflective layer 740 is formed between the encapsulation member 210 and the second electrode 730 in the bottom light emitting pixel Pr. The reflective layer 740 may be separated from the second electrode 730 by a predetermined interval or may contact the second electrode 730.

The reflective layer 740 may be made of the reflective material, e.g., lithium (Li), calcium (Ca), fluorinated lithium/calcium (LiF/Ca), fluorinated lithium/aluminum (LiF/Al), aluminum (Al), silver (Ag), magnesium (Mg), or gold (Au).

The light emitted from the organic emission layer 720 is emitted in the front side by the reflective electrode 715 in the top light emitting pixel Pf. The light emitted from the organic emission layer 720 is emitted in the rear side by the reflective layer 740 in the bottom light emitting pixel Pr. The pixel having the same color on one substrate is formed with the top light emitting pixel Pf and the bottom light emitting pixel Pr such that the dual-side light emitting type organic light emitting diode (OLED) display of the thin film type may be a simple manufacturing process.

The reflective electrode 715, formed in the top light emitting pixel Pf, generates the micro-cavity effect along with the second electrode 730. The second electrode 730 is made of transflective material. The reflective layer 740, formed in the bottom light emitting pixel Pr, generates the micro-cavity effect along with the first electrode 710. The first electrode 710 is made of transflective material such that the organic light emitting diode (OLED) display, according to the second exemplary embodiment, may realize good display qualities, e.g., high photo-efficiency and high color purity.

In the present exemplary embodiment, one switching thin film transistor Qs and one driving thin film transistor Qd are described. However, at least one thin film transistor and a plurality of signal lines may be added.

In the conventional dual-side light emitting OLED display, the manufacturing process is complicated. These complications arise because a top light emitting substrate and a bottom light emitting substrate need to be formed on a display area.

Present embodiments provide a dual-side light emitting display device capable of simplifying a manufacturing method. A top light emitting type substrate and a bottom light emitting type substrate are not both formed. The top light emitting area and the bottom light emitting area are formed in one pixel or in one substrate such that the dual-side light emitting type of organic light emitting diode (OLED) display may be formed through a simple manufacturing process.

According to the present embodiments, the first electrode and the second electrode are made of transflective material, and both formed in the top light emitting area and the bottom light emitting area. The reflective electrode is formed on the first electrode of the top light emitting area. The reflective layer is formed on the second electrode of the bottom light emitting area such that the organic light emitting diode (OLED) display has good display qualities, e.g., high efficiency and high color purity. The organic light emitting diode (OLED) display may also be manufactured with the micro-cavity effect.

According to the present embodiments, the top light emitting pixel and the bottom light emitting pixel having the same color are formed in one substrate such that the dual-side light emitting type organic light emitting diode (OLED) display may be formed through the manufacturing process.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the inventive concept as set forth in the following claims.

What is claimed is:

1. An organic light emitting diode (OLED) display, comprising:
    a substrate, including a first area and a second area;
    a first electrode on the first and second areas of the substrate;
    a reflective electrode on the first area and excluded from being on the second area, and a reflective layer on the second area and excluded from being on the first area;
    a barrier rib on the substrate, the barrier rib having a first opening on the first area that includes the reflective electrode therein, and having a second opening on the second area that has the reflective layer thereabove;
    an organic emission layer on the first and second areas; and
    a second electrode on the organic emission layer at the first and second areas wherein the reflective layer is physically separated from the second electrode.

2. The organic light emitting diode (OLED) display as claimed in claim 1, wherein:
    the organic emission layer in the first area top-emits light toward the second electrode, the reflective electrode being under the second electrode, and
    the organic emission layer the second area bottom-emits light toward the first electrode, the reflective layer being above the second electrode and spaced apart from the second electrode.

3. The organic light emitting diode (OLED) display as claimed in claim 2, further comprising a transistor connected to the first electrode in the first area and the second area,
wherein the organic emission layer in the first area and the second area are formed in one pixel and connected to the transistor through the first electrode.

4. The organic light emitting diode (OLED) display as claimed in claim 3, wherein:
the first opening exposes the reflective electrode in the first area, and
the reflective layer extends above the second opening in the second area and above the barrier rib in a region adjacent to the second area.

5. The organic light emitting diode (OLED) display as claimed in claim 4, wherein:
the first opening and the second opening are formed in one pixel.

6. The organic light emitting diode (OLED) display as claimed in claim 3, further comprising:
an encapsulation member on the reflective layer.

7. The organic light emitting diode (OLED) display as claimed in claim 3, wherein:
the first electrode includes a transflective material.

8. The organic light emitting diode (OLED) display as claimed in claim 7, wherein:
a lower layer of the first electrode is made of ITO or IZO, a middle layer is made of Ag, an upper layer is made of ITO or IZO, and the thickness of the middle layer is less than 200 Å.

9. The organic light emitting diode (OLED) display as claimed in claim 8, wherein:
a lower layer of the reflective electrode is made of ITO or IZO, a middle layer is made of Ag, an upper layer is made of ITO or IZO, and the thickness of the middle layer is more than 1000 Å.

10. The organic light emitting diode (OLED) display as claimed in claim 9, wherein:
the second electrode includes a transflective material.

11. The organic light emitting diode (OLED) display as claimed in claim 2, wherein:
the reflective layer is made of any one of lithium (Li), calcium (Ca), fluorinated lithium/calcium (LiF/Ca), fluorinated lithium/aluminum (LiF/Al), aluminum (Al), silver (Ag), magnesium (Mg), or gold (Au).

12. The organic light emitting diode (OLED) display as claimed in claim 2, wherein:
the first area is formed inside a top light emitting pixel among a plurality of pixels and the second area is formed inside a bottom light emitting pixel.

13. The organic light emitting diode (OLED) display as claimed in claim 12, wherein:
the first area and the second area are respectively formed inside the top light emitting pixel and the bottom light emitting pixel of the same color.

14. The organic light emitting diode (OLED) display as claimed in claim 12, wherein:
the first opening exposes the reflective electrode in the first area, and
the reflective layer extends above the second opening in the second area and above the barrier rib in a region adjacent to the second area.

15. The organic light emitting diode (OLED) display as claimed in claim 14, wherein:
the first opening is formed inside the top light emitting pixel, and the second opening is formed inside the bottom light emitting pixel.

16. The organic light emitting diode (OLED) display as claimed in claim 12, wherein:
an encapsulation member is on the reflective layer.

17. The organic light emitting diode (OLED) display as claimed in claim 12, wherein:
the first electrode includes a transflective material.

18. The organic light emitting diode (OLED) display as claimed in claim 17, wherein:
a lower layer of the first electrode is formed of ITO or IZO, a middle layer is formed of Ag, an upper layer is made of ITO or IZO, and the thickness of the middle layer is less than 200 Å.

19. The organic light emitting diode (OLED) display as claimed in claim 18, wherein:
a lower layer of the reflective electrode is made of ITO or IZO, a middle layer is made of Ag, an upper layer is made of ITO or IZO, and the thickness of the middle layer is more than 1000 Å.

20. The organic light emitting diode (OLED) display as claimed in claim 19, wherein:
the second electrode includes a transflective material.

21. The organic light emitting diode (OLED) display as claimed in claim 12, wherein:
the reflective layer is made of any one of lithium (Li), calcium (Ca), fluorinated lithium/calcium (LiF/Ca), fluorinated lithium/aluminum (LiF/Al), aluminum (Al), silver (Ag), magnesium (Mg), or gold (Au).

* * * * *